United States Patent [19]

Brys

[11] Patent Number: 5,706,239
[45] Date of Patent: Jan. 6, 1998

[54] RECHARGEABLE SRAM/FLASH PCMCIA CARD

[75] Inventor: Wieslaw Brys, Bedford, Mass.

[73] Assignee: Centennial Technologies, Inc., Billerica, Mass.

[21] Appl. No.: 607,609

[22] Filed: Feb. 27, 1996

[51] Int. Cl.$^6$ .................................................. G06F 12/14
[52] U.S. Cl. ............................ 365/226; 365/327; 365/228; 365/185.33
[58] Field of Search .................................. 365/226, 227, 365/228, 229, 185.33, 195, 189.07

[56] References Cited

U.S. PATENT DOCUMENTS

| | | | |
|---|---|---|---|
| 4,645,943 | 2/1987 | Smith, Jr. et al. | 307/150 |
| 4,748,320 | 5/1988 | Yorimoto et al. | 235/492 |
| 4,874,960 | 10/1989 | Cybela | 307/64 |
| 4,945,448 | 7/1990 | Bremenour et al. | 361/383 |
| 4,974,192 | 11/1990 | Face et al. | 364/900 |
| 4,977,509 | 12/1990 | Pitchford et al. | 364/449 |
| 4,985,870 | 1/1991 | Faraci | 365/228 |
| 5,047,988 | 9/1991 | Mizuta | 365/229 |
| 5,144,586 | 9/1992 | Faraci | 365/226 |
| 5,204,963 | 4/1993 | Noya et al. | 395/750 |
| 5,206,938 | 4/1993 | Fujioka | 365/228 |
| 5,226,006 | 7/1993 | Wang et al. | 365/228 |
| 5,276,354 | 1/1994 | Link et al. | 307/66 |
| 5,309,369 | 5/1994 | Kimura | 365/229 |
| 5,396,637 | 3/1995 | Harwell et al. | 395/705 |
| 5,402,008 | 3/1995 | St. John | 307/64 |
| 5,438,549 | 8/1995 | Levy | 365/229 |

*Primary Examiner*—David C. Nelms
*Assistant Examiner*—Vu A. Le
*Attorney, Agent, or Firm*—Weingarten, Schurgin, Gagnebin & Hayes LLP

[57] ABSTRACT

A PCMCIA memory module or card is provided, which module includes volatile SRAM memory, non-volatile FLASH memory, a rechargeable backup battery circuit for providing power to SRAM memory in the event of the absence of primary power, and a user selectable memory paging mode which allows a user to select between multiple addressing schemes.

28 Claims, 3 Drawing Sheets

5,706,239

RECHARGEABLE SRAM/FLASH PCMCIA CARD

FIELD OF THE INVENTION

The present invention is directed to computer memories, and more particularly to a memory card having a battery backup.

BACKGROUND OF THE INVENTION

Memory boards which have volatile memory components are susceptible to data loss if there is a power supply failure or the board is removed from the system in which the board was inserted. Volatile memory components require a continuous supply of electrical power to maintain the data stored within the device memory cells. Typical volatile memory components are static random access memories (SRAM). SRAM memory components have many advantages such as speed, low power consumption, and simple read and write operations.

Non-volatile memories require power to write data therein, but retain stored data indefinitely without any external power supply. However, non-volatile memories may have a limited number of read/write cycles, comparatively long access times due to complex programming algorithms, and may require non-standard voltages. Other non-volatile means may be used to secure data in the event of a power failure such as magnetic tape drives but cost, space and other design drawbacks are present.

A memory module providing the advantages of volatile memory and non-volatile memory would provide many benefits to a user. Information could be stored in non-volatile memory at a central location, which information would be retained by the module indefinitely while the module is transported to a remote location. Information could also be stored in SRAM memory, if the SRAM memory is coupled to a battery backup to retain the data in memory. Thus, information could be stored in the module volatile and non-volatile memory before insertion into a host computer. The host computer could read any information stored in the module memory and operate accordingly.

However, batteries inevitably lose their charge and must be replaced to ensure the integrity of data retained in the battery backed up memory. This requires battery replacement by one having sufficient dexterity to manipulate intricate electrical connections and monitoring of the time interval between battery replacement. Particularly for a Personal Computer Memory Card International Association (PCMCIA) card, a module about the size of a standard credit card, and having fine mechanical interconnections, there is a risk of damage to the fragile host and module components when modules are removed and inserted. Associated with battery replacement, there is the cost of labor, the time lost while the battery is replaced, the data that may have been lost, the potential damage to the module or computer, and the harm to the environment as valuable land fill space is taken up and the possible environmental harm that batteries pose when irresponsibly disposed of.

SUMMARY OF THE INVENTION

In accordance with the present invention, there is provided a PCMCIA memory module or card having volatile and non-volatile memory components including a user selectable paging mode, which module includes a rechargeable backup battery circuit, all disposed on the card.

In an alternative embodiment, the rechargeable backup circuit further includes a first and second battery voltage indicator to allow a user to determine battery status, and whether data being stored in volatile memory components is likely to still be valid.

BRIEF DESCRIPTION OF THE DRAWINGS

The foregoing features of this invention, as well as the invention itself, may be more fully understood from the following detailed description of the drawings in which.

DETAILED DESCRIPTION OF THE INVENTION

Figure 1:
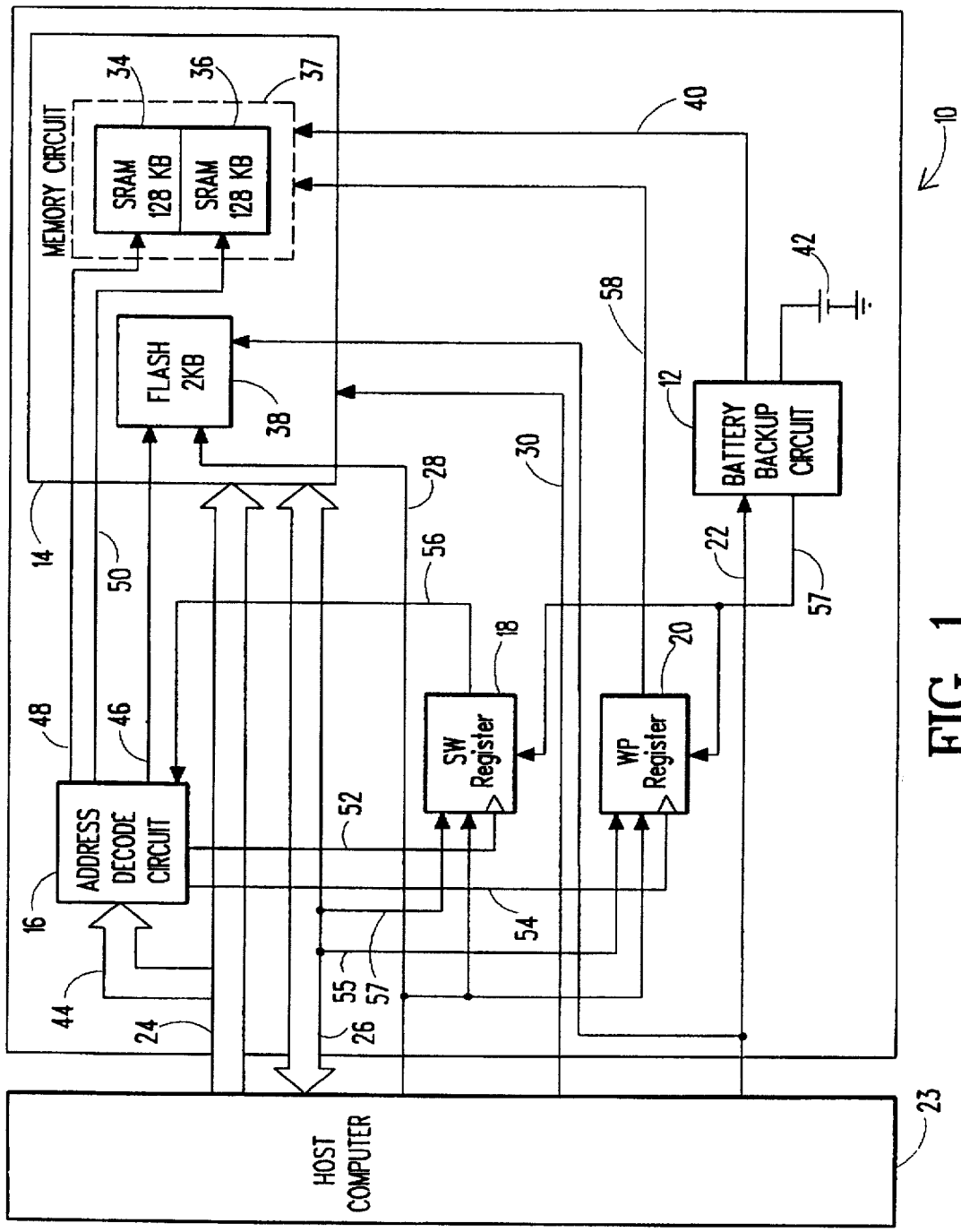
FIG. 1 is a block diagram of a electronic memory module having a backup battery circuit according to the present invention.

In FIG. 1, an illustrative embodiment of an electronic memory module 10 having a battery backup circuit 12 and a user selectable paging scheme is shown. The electronic memory module 10 includes a memory circuit 14, a battery backup circuit 12, an address decode circuit 16, a SW (Switching) register 18, and a WP (Write Protect) register 20. A primary power source is provided to the module 10 via a primary power signal 22 from a host computer 23 which could be a lap top computer or other type of computer. The primary power signal 22 in the present embodiment provides about five volts, but other voltages, such as positive three volts may be used. The host computer 23 provides a unidirectional address bus 24, a bidirectional data bus 26, a write enable signal 28, an output enable signal 30.

The electronic module 10 as illustrated, is of a PCMCIA type and is compliant with PCMCIA size, electrical, and timing requirements. A PCMCIA card has an outline similar to that of a typical consumer credit card. The memory module 10, in an illustrative embodiment, is designed for insertion into a host computer 23. Since the primary power source signal 22 for the electronic memory module 10 is derived from the host computer 23, which may itself be powered from a battery, power consumption is critical.

The memory circuit 14 includes a first SRAM component 34, a second SRAM memory component 36, and a flash memory component 38. The first and second SRAM memory components 34 and 36 respectively, form the SRAM memory 37. In an illustrative embodiment, the first and second SRAM components 34 and 36, comprise one Megabit CMOS static random access memories (SRAMs) having a 128K×8 organization, and the flash memory component 38 comprises a flash technology 2 Megabit RAM with a 256K×8 organization. The flash memory component 38 is not volatile and therefore not susceptible to data loss from a primary power source failure or from removal of the memory module 10 from the host computer 23. The flash memory component 38 receives power via the primary power signal 22 provided by the host computer 23.

In normal operation, SRAM power signal 40 provides power to the SRAM memory 37, which signal is powered from the primary power signal 22 when primary power from the host computer 23 is present. If the voltage provided by the primary power signal 22 is absent, power to the SRAM memory 37 is supplied via the SRAM power signal 40 from a battery 42.

The memory circuit 14 receives the address bus 24 driven by the host computer 23. The address decode circuit 16 provides an address in accordance with the later discussed paging scheme by a SW signal 56 provided by the SW register 18 which is under the control of a user.

The address decode circuit 16 receives an upper portion 44 of the address bus and provides to the memory circuit 14 a flash memory enable signal 46, a first SRAM enable signal 48, and a second SRAM enable signal 50. Each of the enable signals 46, 48 and 50 respectively, corresponds to the associated memory component, which component 38, 34 or 36 respectively, provides a portion of the addressable memory space available on the memory module 10. The address decode circuit 16 further provides a SW register select signal 52 and a WP register select signal 54. Select signals 52 and 54 become active when the host computer 23 provides an address to the address bus 24 that corresponds to the selected device during a write cycle.

The WP register 20 serves to prohibit a write cycle to the first and second SRAM components 34 and 36 from occurring when the WP register 20 has been put in an active state by the host computer 23. A power on reset signal 59 ensures that as the memory module 10 receives power, the WP register 20 will be active thereby preventing a write cycle to SRAM memory 37 until the WP register has been put in an inactive state by the host computer 23. The WP register 20 provides an SRAM write enable signal 58 to SRAM memory components 34 and 36. The SRAM write enable signal 58 will not go active if the WP register 20 is set. A user may control the WP register 20 by writing to the WP register address whereby the data present at data bit zero 55, which forms a portion of the data bus 26, will be written to the WP register. Write cycles to the flash memory component 38, the WP register 20, and the SW register 18 are unaffected by the WP register contents, as the write enable signal 28 from the host computer 23 is coupled directly to the respective devices.

Figure 2:
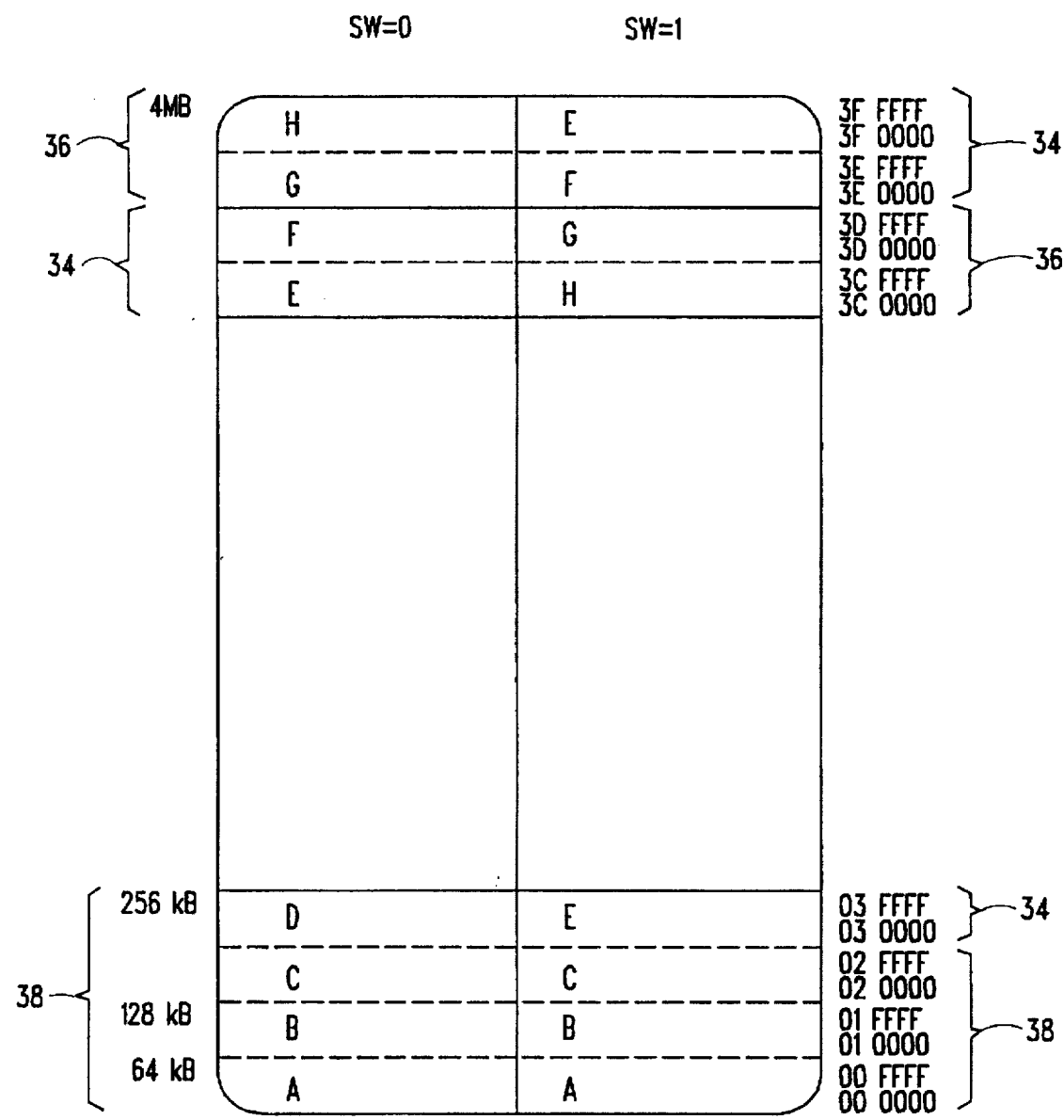
FIG. 2 is a block diagram of the memory map and paging scheme of the embodiment of FIG. 1.

The SW register 18 provides a user selectable paging scheme, i.e., multiple memory maps depending on the SW register 18 contents. Similar to the WP register 20, the user controls the SW register 18 by writing the data appearing on data bit four 57 which forms a portion of the data bus 26 to the WP register. In FIG. 2, there is illustrated a memory map for the memory module 10 for the SW register 18 not being set, i.e., SW=0, and the SW register being set, i.e., SW=1. The default setting for the SW register 18 is SW=0, whereby the power on reset signal provides that SW=0 after power up and until changed by a user. The SW signal 56 is provided to the address decode circuit 16 by the SW register 18. The SW signal 56 operates as part of a module paging scheme implemented on the memory module 10. For SW=0 the flash memory component 38 provides memory space for addresses 000000 to 03FFFF Hex (H) whereby the flash memory enable signal 46 is active. The first and second SRAM components 34 and 36 respectively, each provide 128 kilobytes (KB) of addressable memory space. For addresses 3C0000 to 3DFFFF H, the first SRAM enable signal 48 will be activated, and for addresses 3E0000 to 3FFFFF H the second RAM enable signal 50 will be activated.

For SW=1, addresses 000000 to 2FFFF address flash memory component 38 locations, and addresses 30000 to 3FFFF H address the first SRAM component 34, as well as addresses 3E0000 to 3FFFFF H. Addresses 3C0000 to 3DFFFF H address the memory space within the second SRAM component 36. It should further be noted that the SW signal 56 also changes the memory division of the first and second SRAM components 34 and 36. More particularly, dividing the addressable memory space into 64 KB (10000 H) blocks as represented in FIG. 2 as capital letters (i.e. A, B, C . . . H), the address mapping of the first and second SRAM components 34 and 36 will be inverted by the blocks of 64 KB. As an example, address 3EXXXX H (where X represents a don't care condition), will address a memory location within the lower 64 KB block of the second SRAM component 36 for SW=0, represented as letter 'G' in FIG. 2. For the case where SW=1, address 3EXXXX H will address a memory location within the upper 64 KB of the first SRAM component 34.

The above described user selectable paging scheme has utility for data protection and verification that a specific type of PCMCIA card having the corresponding paging scheme only is inserted into the particular host. For example, where a user has not set the SW register 18, and writes to a particular SRAM memory location and then the user sets the SW register, the user can verify that the data is there or not there depending upon user intent. In this example, the data is written to a different place in the addressable memory space while the host computer 23 provides the same address, depending upon the state of the SW signal 56.

The battery backup circuit 12 receives the primary power signal 22 from the host computer 23. In the event that there is a failure of the primary power signal 22, defined as a voltage on the primary power signal below a predetermined voltage such as four volts, the battery backup circuit 12 generates the reset signal 59 and provides power to the memory circuit 14 SRAM memory components 34 and 36 from a battery 42 via the SRAM power signal 40. Further, since the battery backup circuit 12 is disposed on the module 10, removal of the module from the host computer 23 does not result in loss of data stored in SRAM memory 37. Thus, the modules can be programmed at a central location and later placed in a remote computer without having the computer store data in the module.

As the battery 42 must supply power to SPAM memory 37 to retain stored data when power is not otherwise supplied thereto, power consumption is critical. In an illustrative embodiment, the power required by SRAM memory 37 to retain stored data by power provided by the battery backup circuit 12 is about twelve micro Watts at typical room temperature.

Figure 3:
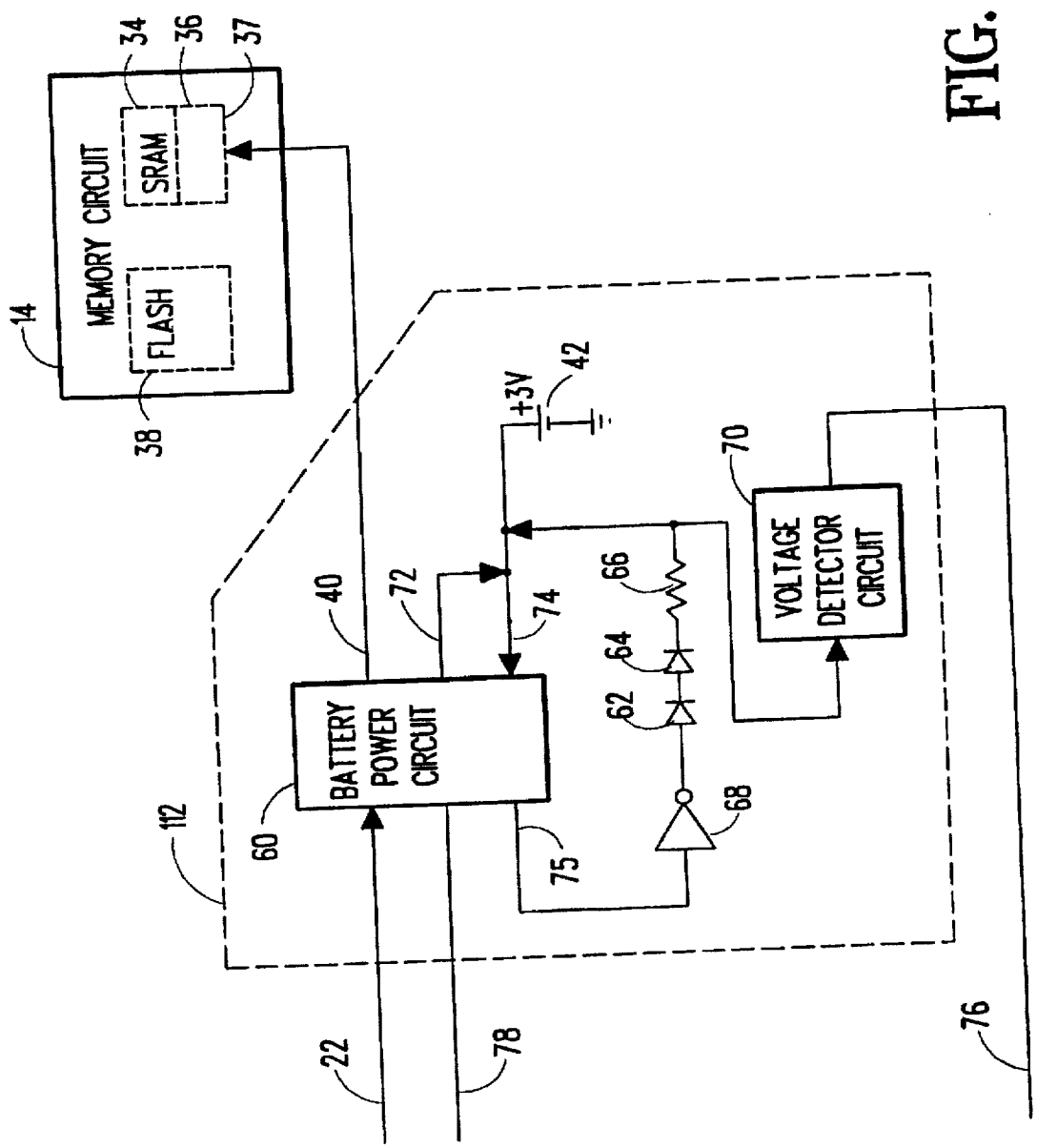
FIG. 3 is a schematic diagram of the battery backup circuit of an alternative embodiment of the electronic memory module of FIG. 1.

A backup battery circuit 112 of an alternative embodiment of an electronic memory module is shown in more detail in FIG. 3. The backup battery circuit 112 includes a first and second battery voltage indicator signal, 76 and 78 respectively. As shown, the battery backup circuit 112 includes a battery power circuit 60, a rechargeable battery 42, a first diode 62, a second diode 64, a resistor 66, an inverter 68, and a voltage detector circuit 70. In the event that the primary power signal 22 goes below a predetermined voltage, the battery power circuit 60 senses the voltage decrease and allows the battery 42 to supply power to the volatile SPAM components 34 and 36, thus retaining data stored in volatile memory. The first diode 62, the second diode 64, the resistor 66 and the inverter 68 operate as a voltage/current source to recharge the rechargeable battery 42.

The rechargeable battery 42 is a lithium battery charged to about three volts. The battery 42 is coupled to the battery power circuit 60, the resistor 66 and an input of the voltage detector circuit 70. The battery 42 is connected to the backup battery circuit 60 via a trickle recharge signal 72 and a battery voltage input signal 74. The first diode 62, second diode 64 and resistor 66 are connected in series. The first diode 62 is connected to an output of the inverter 68. A battery voltage alarm signal 75 from the battery power circuit 60 is an input to the inverter 68. In the exemplary embodiment, the battery power circuit 60 is a Fujitsu MB3790 BiCMOS Battery Backup IC for Power Supplies, but is not to be limited thereto.

The first and second battery voltage indicator signals 76,78 allow a user to monitor the status of the battery 42 via the host computer 23. The battery 42 is monitored by lopredeterr two predetermined levels of battery voltage of about 2.37 and 2.15 volts. If the battery voltage falls below about 2.37 volts, the second battery voltage indicator signal 78 becomes active. If the battery 42 voltage falls below about 2.15 volts, the first battery voltage indicator signal 76 becomes active. Thus, if the first battery voltage indicator signal 76 is not active and the second battery voltage indicator signal 78 is active, data stored in the SRAM memory 37 is maintained, but the battery 42 voltage is low and needs recharging. If the first battery voltage indicator signal 76 is active, in which case the second battery voltage signal 78 is also active, data stored in SRAM memory 37 is unreliable.

The recharging of the battery 42 occurs on two levels. If the battery voltage is less than about three volts as provided to the battery power circuit 60 by the battery voltage input signal, the trickle recharge signal 72 provides a relatively small current flow to the battery 42 so as not to damage the battery as the battery approaches a condition of complete recharge. If the battery voltage falls below about 2.67 volts, the battery voltage alarm signal 75 will go to a logical low which is then inverted by inverter 68 which outputs a logical high. The logical high from the inverter 68 allows current to flow through first diode 62, second diode 64, and resistor 66 which operate as a controlled power source to provide the battery 42 with additional current flow to decrease the time required to recharge the battery.

Other configurations are contemplated. For example, the memory module of the present invention may be inserted into palm top computers or other computer types that accept PCMCIA circuit cards. Further, the battery may be types other than the lithium battery herein described. In addition, other paging modes may be implemented without departing from the scope and spirit of the present invention. Furthermore, other memory configurations are contemplated such as a sixteen-bit wide data bus, memory components having more and less storage locations, and more memory components of the type herein disclosed thus providing additional addressable memory space. Other alternative circuits may be used to accomplish a determination of the battery charge condition that fall within the scope of the appended claims.

Although the invention has been shown and described with respect to illustrative embodiments thereof, it should be understood by those of ordinary skill in the art that the foregoing and various other changes, additions and omissions in the form and detail thereof may be made without departing from the spirit and scope of the invention as delineated in the claims.

What is claimed is:

1. A PCMCIA memory module adapted for coupling to a primary power source, having a backup power source for supplying backup battery power to volatile memory components in the absence of primary power from said primary power source, said module comprising:

a circuit board;

at least one volatile random access memory component electrically connected on said circuit board;

at least one non-volatile writable memory component electrically connected on said circuit board; and a rechargeable backup battery circuit electrically connected on said circuit board to said at least one volatile random access memory component;

wherein said at least one non-volatile memory component and said at least one volatile random access memory component have user selectable multiple absolute memory maps.

2. A PCMCIA memory module adapted for coupling to a primary power source, having a backup power source for supplying backup battery power to volatile memory components in the absence of primary power from said primary power source, said module comprising:

a circuit board;

at least one volatile random access memory component electrically connected on said circuit board;

at least one non-volatile writable memory component electrically connected on said circuit board; and a rechargeable backup battery circuit electrically connected on said circuit board to said at least one volatile random access memory component;

wherein said at least one non-volatile memory component and said at least one volatile random access memory component have user selectable multiple memory maps;

wherein said rechargeable backup battery circuit includes a backup battery and a battery voltage indicator whereby said battery voltage indicator is in a first logical state when said backup battery has a voltage below a predetermined level, and in a second logical state when said backup battery has a voltage at or above said predetermined level.

3. The PCMCIA module according to claim 1, wherein said rechargeable backup battery circuit includes a backup battery, a first battery voltage indicator and a second battery voltage indicator, said first battery voltage indicator being in a first logic state when said backup battery has a voltage below a first predetermined level, said second battery voltage indicator being in a second logic state when said backup battery has a voltage below a second predetermined level.

4. The PCMCIA module according to claim 1, wherein said rechargeable backup circuit includes a rechargeable battery wherein said rechargeable battery is recharged by a first current flow when said battery has a voltage at or above a first voltage level, and wherein said battery is recharged by said first current flow and a second current flow when said battery has a voltage below said first voltage level.

5. The PCMCIA module according to claim 1, wherein said rechargeable backup battery circuit detects the absence of said primary power.

6. The PCMCIA module according to claim 1, wherein said volatile random access memory component includes a static random access memory component.

7. The PCMCIA module according to claim 1, wherein said non-volatile memory component includes a flash memory component.

8. The PCMCIA module according to claim 1, wherein said electronic module further includes a write protect circuit.

9. The PCMCIA module according to claim 1, wherein said electronic module is low power.

10. The PCMCIA module according to claim 1, wherein said electronic module is insertable within a portable computer.

11. The PCMCIA module according to claim 1, wherein said electronic module is insertable within a palm top computer.

12. The PCMCIA module according to claim 3, wherein said first and second battery voltage indicators are electrically connected to a computer.

13. The PCMCIA module according to claim 2, wherein said battery is a lithium battery.

14. The PCMCIA module according to claim 1, wherein said at least one random access memory component contains data retained by said backup battery circuit prior to insertion within a computer.

15. A PCMCIA memory module adapted for insertion into a portable computer, said module receiving a primary power signal from said portable computer, said module comprising:
   a circuit board having electrically connected thereon:
      volatile memory;
      non-volatile memory; and
      a battery backup circuit;
   wherein said random access memory and said flash memory include a user selectable absolute memory map.

16. A PCMCIA memory module adapted for insertion into a portable computer, said module receiving a primary power signal from said portable computer, said module comprising:
   a circuit board having electrically connected thereon:
      volatile memory;
      non-volatile memory; and
      a battery backup circuit;
   wherein said random access memory and said flash memory include a user selectable memory map;
   wherein said battery backup circuit includes a rechargeable battery wherein said battery is recharged by a trickle recharge current when said battery has a voltage at or above a first voltage level, and wherein said battery is recharged by said trickle recharge current and by a current/voltage source when said battery has a voltage below said first voltage level.

17. The PCMCIA module according to claim 15, wherein said volatile memory includes at least one static random access memory component.

18. The PCMCIA module according to claim 15, wherein said non-volatile memory includes at least one flash memory component.

19. The PCMCIA module according to claim 15, wherein said user selectable memory map is controlled from said portable computer.

20. The PCMCIA module according to claim 15, wherein said battery backup circuit includes a rechargeable battery.

21. The PCMCIA module according to claim 15, wherein said battery backup circuit includes a first battery voltage indicator.

22. The PCMCIA module according to claim 21, wherein said first battery voltage indicator is in a first logic state when said battery voltage is below a first predetermined level, and a second logic state when said battery voltage is at or above said first predetermined level.

23. The PCMCIA module according to claim 21, wherein said battery backup circuit includes a second battery voltage indicator being in a third logic state when said battery voltage is below a second predetermined level, and being in a fourth logic state when said battery voltage is at or above said second predetermined level.

24. The PCMCIA module according to claim 15, wherein said battery backup circuit includes a logic circuit for detecting when said primary power signal is below a first predetermined level.

25. The PCMCIA module according to claim 15, wherein said module further includes a write protect circuit.

26. The PCMCIA module according to claim 20, wherein said battery backup circuit includes a logic circuit for recharging said rechargeable battery.

27. A PCMCIA memory module adapted for insertion into a portable computer, said module receiving a primary power signal from said portable computer, said PCMCIA memory module comprising:
   a circuit board having electrically connected thereon:
      at least one SRAM memory component;
      at least one FLASH memory component;
      an address decode circuit coupled to said SRAM and FLASH memory components for decoding an address bus;
      a write protect register coupled to said SRAM memory component for inhibiting a write cycle to said SRAM memory when said write protect register is set by a user;
      a switching register coupled to said address decode circuit for allowing a user to select a first or a second memory map; and
      a backup battery circuit electrically connected to said at least one SRAM memory component for providing power to said SRAM memory component in the event of a failure of said primary power signal;
   wherein said at least one SRAM memory component and at least one FLASH memory component memory locations are mapped by said first or second memory maps;
   said battery circuit comprising:
      a rechargeable battery having a first terminal and a second terminal;
      a battery backup circuit providing a battery voltage input signal, a second battery voltage indicator signal, a SRAM power signal and a trickle recharge signal, and receiving said primary power signal, and said battery voltage input signal, said battery voltage input signal and said trickle recharge signal coupled to said battery first terminal, said SRAM power signal coupled to said SRAM memory component;
      an inverter having an input terminal and an output terminal, said battery voltage input signal coupled to said inverter input terminal;
      a series coupled diode and resistor coupled in series between said inverter output terminal and said battery first terminal; and
      a voltage detector circuit having an input terminal and a output terminal, said input terminal coupled to said battery first terminal, said output terminal providing a first battery voltage indicator signal;
   wherein said battery is recharged by current provided by said trickle recharge signal when said battery voltage is at or above a first voltage level, and wherein said battery is recharged by said current provided by said trickle recharge signal and by current through said resistor when said battery voltage is below said first voltage level.

28. The PCMCIA module according to claim 27, wherein said rechargeable battery is a lithium battery.

* * * * *